United States Patent
Kim et al.

(10) Patent No.: US 8,399,176 B2
(45) Date of Patent: Mar. 19, 2013

(54) PHOTOSENSITIVE RESIN COMPOSITION

(75) Inventors: Han Kook Kim, Daejeon (KR); Sung Hyun Kim, Daejeon (KR); Jae Joon Kim, Daejeon (KR); Bog Ki Hong, Daejeon (KR); Mi Ae Kim, Daejeon (KR); Seung Jin Yang, Daejeon (KR); Sang Moon Yoo, Daejeon (KR); Sun Hwa Kim, Daejeon (KR); Won Jin Chung, Daejeon (KR)

(73) Assignee: LG Chem, Ltd., Seoul (KR)

( * ) Notice: Subject to any disclaimer, the term of this patent is extended or adjusted under 35 U.S.C. 154(b) by 263 days.

(21) Appl. No.: 12/713,587

(22) Filed: Feb. 26, 2010

(65) Prior Publication Data
US 2010/0216073 A1    Aug. 26, 2010

(30) Foreign Application Priority Data

Feb. 26, 2009  (KR) .................. 10-2009-0016189
Dec. 8, 2009    (KR) .................. 10-2009-0121018

(51) Int. Cl.
*G03F 7/033*    (2006.01)
*G03F 7/029*    (2006.01)
*B41C 1/10*      (2006.01)
*C08G 12/12*    (2006.01)

(52) U.S. Cl. ............... 430/284.1; 430/287.1; 430/285.1; 430/910; 430/302; 525/193

(58) Field of Classification Search .......................... None
See application file for complete search history.

(56) References Cited

U.S. PATENT DOCUMENTS

| | | | |
|---|---|---|---|
| 2,760,863 A * | 8/1956 | Plambeck, Jr. | 430/306 |
| 2,964,401 A * | 12/1960 | Plambeck, Jr. | 430/281.1 |
| 3,046,127 A * | 7/1962 | Livingston et al. | 430/281.1 |
| 5,196,487 A * | 3/1993 | Kogure et al. | 525/343 |
| 2002/0192596 A1 * | 12/2002 | Ueda et al. | 430/281.1 |
| 2006/0229376 A1 * | 10/2006 | Hayashi et al. | 522/6 |

FOREIGN PATENT DOCUMENTS

WO    WO 2009061159 A2 *  5/2009

OTHER PUBLICATIONS

"Reactive Groups | CAMEO Chemicals | NOAA" from http://cameochemicals.noaa.gov/browse/react printed Jan. 17, 2012, 2 pages.*

* cited by examiner

*Primary Examiner* — Cynthia Hamilton
(74) *Attorney, Agent, or Firm* — Rothwell, Figg, Ernst & Manbeck, P.C.

(57) ABSTRACT

Disclosed is a photosensitive resin composition suitable for use in a transflective liquid crystal display (LCD). The photosensitive resin composition uses, as an alkali-soluble binder resin, a blend of two kinds of binder resins. The first binder resin has a weight average molecular weight greater than or equal to 1,000 but lower than 20,000 and contains no reactive group. The second binder resin has a weight average molecular weight greater than or equal to 20,000 but lower than 80,000 and contains reactive groups. The photosensitive resin composition has good adhesion to an underlying substrate while forming a high resolution fine pattern.

10 Claims, 1 Drawing Sheet

PHOTOSENSITIVE RESIN COMPOSITION

CROSS REFERENCE TO RELATED APPLICATIONS

This application claims priority from Korean patent application no. 10-2009-0016189 filed on Feb. 26, 2009, and Korean patent application no. 10-2009-0121018 filed on Dec. 8, 2009, each of which is incorporated herein by reference in its entirety for all purposes.

BACKGROUND OF THE INVENTION

1. Field of the Invention

The present invention relates to a photosensitive resin composition that uses, as an alkali-soluble binder resin, a blend of two kinds of binder resins to ensure the formation of a rectilinear pattern and good adhesion to a substrate while achieving high resolution suitable for use in a transflective liquid crystal display (LCD).

2. Description of the Related Art

A liquid crystal display (LCD) includes upper and lower transparent insulating substrates and a liquid crystal layer interposed therebetween. The liquid crystal layer is formed by injecting a liquid crystal having an anisotropic dielectric constant between the two substrates. Voltages are applied to the liquid crystal layer to change the arrangement of the liquid crystal molecules. This molecular arrangement controls the amount of light passing through the liquid crystal layer to display desired images.

LCDs are not self-luminous devices, and therefore require external light sources. LCDs are broadly classified into transmissive LCDs and reflective LCDs by the type of external light sources they employ.

A transmissive LCD uses a cold cathode fluorescent lamp (CCFL) or a light emitting diode (LED) as a light source. A reflective LCD reflects external incident light and uses the reflected light as a light source. The transmissive LCD can emit bright light, but it suffers from the drawback of high power consumption. The reflective LCD has the advantage of low power consumption, but it cannot be used when external light is weak.

Various attempts have been made to overcome the limitations of the two types of LCDs. For example, considerable research has been conducted to develop and commercialize transflective LCDs that are driven by a reflective LCD in the presence of an external light source and are driven in a transmissive mode when external light is not sufficient.

A photosensitive resin composition for use in a transflective LCD is required to meet processing characteristics for forming more complex and finer patterns than patterns of existing structures. Another requirement of the photosensitive resin composition is good adhesion to an underlying substrate while forming narrow patterns. In contrast, conventional photosensitive resin compositions cannot simultaneously meet the requirements for the adhesion to underlying substrates and the formation of high resolution fine patterns. That is, some conventional photosensitive resin compositions sacrifice adhesion to underlying substrates to form high resolution fine patterns. Some conventional photosensitive resin compositions with good adhesiveness have difficulty in forming high resolution patterns.

SUMMARY OF THE INVENTION

It is an object of the present invention to provide a photosensitive resin composition that forms a high resolution fine pattern and has good adhesion to an underlying substrate.

As a result of intensive research to solve the problems of the prior art, the inventors of the present invention have found that a photosensitive resin composition using a blend of two kinds of binder resins having different molecular weight distributions in an appropriate weight ratio, one of which contains no reactive group and the other contains reactive groups, as an alkali-soluble binder resin has physical properties suitable for use in a transflective LCD. The present invention has been achieved based on this finding.

According to the present invention, there is provided a photosensitive resin composition comprising, as an alkali-soluble binder resin, a blend of a first binder resin and a second binder resin wherein the first binder resin has a weight average molecular weight greater than or equal to 1,000 but lower than 20,000 and contains no reactive group and the second binder resin has a weight average molecular weight greater than or equal to 20,000 but lower than 80,000 and contains reactive groups.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Figure 1:
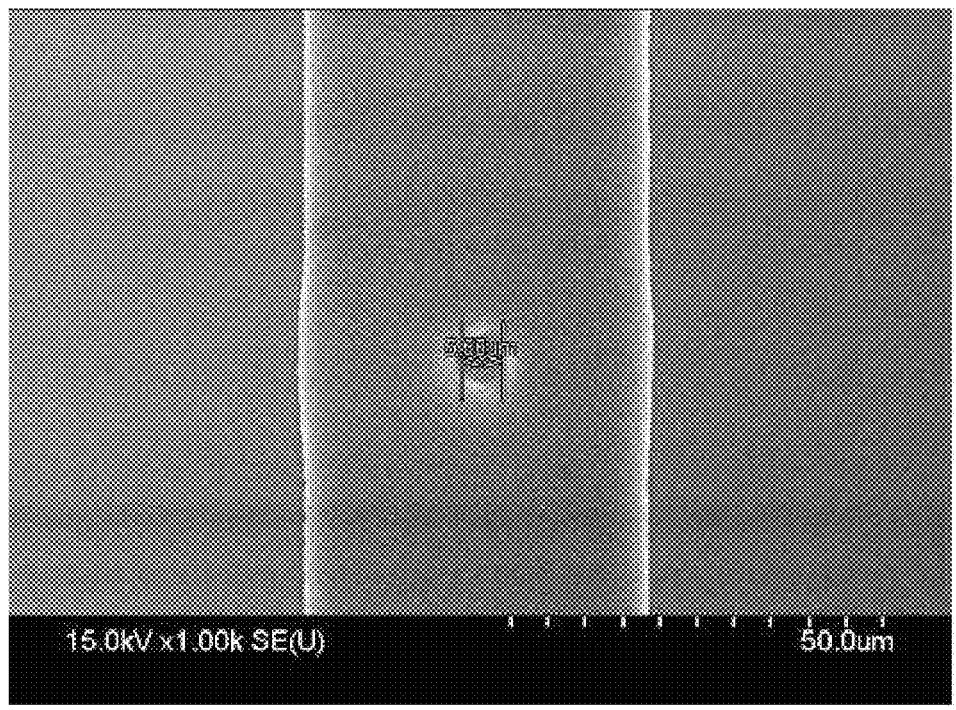
FIG. 1 is a scanning electron microscopy (SEM) image of a pattern formed using a photosensitive resin composition prepared in Example 3 through a mask having a square hole (20×20 μm) in a 40 μm wide linear pattern.

Exemplary embodiments of the present invention will now be described in more detail.

The present invention provides a photosensitive resin composition which comprises an alkali-soluble binder resin, a colorant, a polymerizable compound having at least one ethylenically unsaturated bond, a photoinitiator, a solvent and one or more additives wherein the alkali-soluble binder resin is a blend of two kinds of binder resins.

Specifically, the alkali-soluble binder resin is a blend of a first binder resin and a second binder resin. More specifically, the first binder resin has a weight average molecular weight greater than or equal to 1,000 but lower than 20,000 and contains no reactive group; and the second binder resin has a weight average molecular weight greater than or equal to 20,000 but lower than 80,000 and contains reactive groups.

That is, the first binder resin is characterized by a relatively low weight average molecular weight and the absence of reactive groups, and the second binder resin is characterized by a relatively high weight average molecular weight and the presence of reactive groups. Based on these characteristics, the first binder resin functions to increase the resolution of the photosensitive resin composition and the second binder resin contributes to an improvement in the adhesiveness of the photosensitive resin composition upon pattern formation because its reactive groups react with the monomer in the presence of the photoinitiator.

The reactive groups of the second binder resin mean unsaturated double bonds.

The first binder resin has a weight average molecular weight greater than or equal to 1,000 but lower than 20,000 and preferably from 5,000 to 10,000. If the first binder resin has a weight average molecular weight of less than 1,000, a pattern cannot be sufficiently formed. Meanwhile, if the first binder resin has a weight average molecular weight not lower than 20,000, desired high resolution characteristics of a pattern cannot be expected.

The second binder resin has a weight average molecular weight greater than or equal to 20,000 but lower than 80,000 and preferably from 20,000 to 50,000. If the second binder resin has a weight average molecular weight of less than 20,000, a pattern cannot be sufficiently formed. Meanwhile, if the second binder resin has a weight average molecular weight not lower than 80,000, desired development characteristics of a pattern cannot be expected.

Specifically, the first binder resin contains repeating units of Formulae 1, 2 and 3:

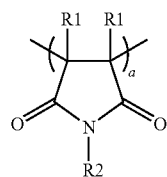
(1)

wherein each R1 is independently a hydrogen atom or a methyl group, R2 is selected from the group consisting of $C_1$-$C_{10}$ alkyl groups; $C_1$-$C_6$ alkyl ester groups; phenyl groups substituted with one or more $C_1$-$C_3$ alkyl groups; and phenyl groups substituted with one or more halogen atoms, and a is from 10 to 30;

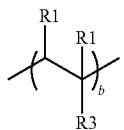
(2)

wherein each R1 is independently a hydrogen atom or a methyl group, R3 is selected from the group consisting of $C_2$-$C_6$ alkylene ester groups substituted with one or more phenyl groups (in which each phenyl is optionally substituted with $C_1$-$C_3$ alkyl, halogen or hydroxyl group); $C_2$-$C_8$ alkylene ester groups; phenylene ester groups unsubstituted or substituted with a $C_1$-$C_3$ alkyl group or a halogen atom; phenyl groups optionally substituted with $C_1$-$C_3$ alkyl, halo or hydroxyl group; and $C_1$-$C_4$ alkyl groups substituted with one or more phenyl groups, and b is from 10 to 80;

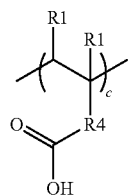
(3)

wherein each R1 is independently a hydrogen atom or a methyl group, and R4 is a direct bond; or is selected from the group consisting of $C_1$-$C_{10}$ alkylene groups; $C_1$-$C_6$ alkylene groups substituted with one or more halogen atoms; and $C_1$-$C_6$ alkylene groups substituted with one or more phenyl groups, and c is from 10 to 40.

Specifically, the second binder resin contains repeating units of Formulae 4, 5 and 6:

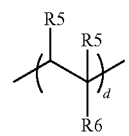
(4)

wherein each R5 is independently a hydrogen atom or a methyl group, R6 is selected from the group consisting of $C_2$-$C_6$ alkylene ester groups substituted with one or more phenyl groups (in which each phenyl is optionally substituted with $C_1$-$C_3$ alkyl, halogen or hydroxyl group); $C_2$-$C_3$ alkylene ester groups; and phenylene ester groups unsubstituted or substituted with a $C_1$-$C_3$ alkyl group or a halogen atom, and d is from 10 to 80;

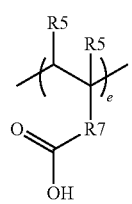
(5)

wherein each R5 is independently a hydrogen atom or a methyl group, and R7 is a direct bond; or is selected from the group consisting of $C_1$-$C_{10}$ alkylene groups; $C_1$-$C_6$ alkylene groups substituted with one or more halogen atoms; and $C_1$-$C_6$ alkylene groups substituted with one or more phenyl groups, and e is from 10 to 40;

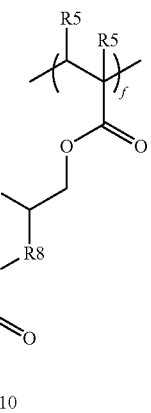
(6)

wherein each R5 is independently a hydrogen atom or a methyl group, R8 is selected from the group consisting of $C_1$-$C_{10}$ alkylene groups; and $C_1$-$C_6$ alkylene groups substituted with one or more halogen atoms; R9 is a hydrogen atom or a methyl group, each R10 is independently a hydrogen atom or a $C_1$-$C_3$ alkyl group, and f is from 10 to 50.

The repeating units of Formulae 3 and 5 are monomers that provide acid groups to the first and second binder resins, respectively. The repeating unit of Formula 6 is a reaction product of the repeating unit of Formula 5 with an epoxy compound containing an unsaturated double bond. At this time, the reaction occurs at the acid groups of the repeating unit of Formula 5.

The desired effects of the present invention are more remarkably exhibited when the first binder resin is used in an amount equal to or larger than the amount of the second binder resin in the alkali-soluble resin. Specifically, the first binder resin is blended with the second binder resin in a weight ratio of 1:1 to 4:1 and preferably 3:1. Out of this range, the inherent characteristics of the respective binder resins are not sufficiently available.

Preferably, the alkali-soluble binder resin has an acid value of 50 to 200 mgKOH/g and a weight average molecular weight of 1,000 to 80,000. In terms of the pattern-forming properties and reliability of the photosensitive resin composition, it is preferred that the alkali-soluble binder resin is present in an amount of 5 to 30% by weight, based on the total weight of the photosensitive resin composition.

In comparison with the use of a conventional binder resin including one or more monomers having reactive groups or one or more monomers having no reactive group, the use of a blend of a binder resin containing no reactive group and a binder resin containing reactive groups, whose molecular weights are different, as an alkali-soluble binder resin, as in the present invention, brings an advantage in that the inherent characteristics of the respective binder resins can be imparted to a photoresist.

The photosensitive resin composition of the present invention may comprise 3 to 30% by weight of the colorant, 1 to 30% by weight of the polymerizable compound, 0.5 to 5% by weight of the photoinitiator, and 10 to 90% by weight of the solvent.

Examples of the colorant include Carmine 6B (C.I. 12490), Phthalocyanine Green (C.I. 74260), Phthalocyanine Blue (C.I. 74160), Perylene Black (BASF K0084 and K0086), Cyanine Black, Lionol Yellow (C.I. 21090), Lionol Yellow GRO (C.I. 21090), Benzidine Yellow 4T-564D, Victoria Pure Blue (C.I.42595), C.I. PIGMENT RED 3, 23, 97, 108, 122, 139, 140, 141, 142, 143, 144, 149, 166, 168, 175, 177, 180, 185, 189, 190, 192, 202, 214, 215, 220, 221, 224, 230, 235, 242, 254, 255, 260, 262, 264 and 272, C.I. PIGMENT GREEN 7 and 36, C.I. PIGMENT BLUE 15:1, 15:3, 15:4, 15:6, 16, 22, 28, 36, 60 and 64, C.I. PIGMENT YELLOW 13, 14, 35, 53, 83, 93, 95, 110, 120, 138, 139, 150, 151, 154, 175, 180, 181, 185, 194 and 213, and C.I. PIGMENT VIOLET 15, 19, 23, 29, 32 and 37. White pigments and fluorescent pigments may also be used. These pigments may be used alone or as a mixture of two or more thereof.

The polymerizable compound having at least one ethylenically unsaturated bond is selected from: compounds obtained by esterifying an α,β-unsaturated carboxylic acid with a polyhydric alcohol, such as ethyleneglycol di(meth)acrylate, polyethyleneglycol di(meth)acrylate having 2 to 14 ethylene groups, trimethylolpropane di(meth)acrylate, trimethylolpropane tri(meth)acrylate, pentaerythritol tri(meth)acrylate, pentaerythritol tetra(meth)acrylate, propylene glycol di(meth)acrylate having 2 to 14 propylene groups, dipentaerythritol penta(meth)acrylate and dipentaerythritol hexa(meth)acrylate; compounds obtained by adding (meth) acrylic acid to a glycidyl group-containing compound, such as a trimethylolpropane triglycidyl ether acrylic acid adduct and a bisphenol A diglycidyl ether acrylic acid adduct; esterified products of a compound having at least one hydroxyl group or ethylenically unsaturated bond, such as phthalic acid diester of (3-hydroxyethyl(meth)acrylate or a toluene diisocyanate adduct of β-hydroxyethyl (meth)acrylate, with a polyvalent carboxylic acid, and adducts thereof with polyisocyanate; alkyl esters of (meth)acrylic acid, such as methyl (meth)acrylate, ethyl(meth)acrylate, butyl (meth)acrylate and 2-ethylhexyl(meth)acrylate; and mixtures thereof.

Examples of the photoinitiator include triazine compounds, such as 2,4-trichloromethyl-(4'-methoxyphenyl)-6-triazine, 2,4-trichloromethyl-(4'-methoxystyryl)-6-triazine, 2,4-trichloromethyl-(piperonyl)-6-triazine, 2,4-trichloromethyl-(3',4'-dimethoxyphenyl)-6-triazine and 3-{4-[2,4-bis (trichloromethyl)-s-triazin-6-yl]phenylthio}propanoic acid; biimidazole compounds, such as 2,2'-bis(2-chlorophenyl)-4, 4',5,5'-tetraphenylbiimidazole and 2,2'-bis(2,3-dichlorophenyl)-4,4',5,5'-tetraphenylbiimidazole; acetophenone compounds, such as 2-hydroxy-2-methyl-1-phenylpropan-1-one, 1-(4-isopropylphenyl)-2-hydroxy-2-methylpropan-1-one, 4-(2-hydroxyethoxy)-phenyl (2-hydroxy)propyl ketone, 1-hydroxycyclohexyl phenyl ketone, benzoin methyl ether, benzoin ethyl ether, benzoin isobutyl ether, benzoin butyl ether, 2,2-dimethoxy-2-phenyl acetophenone, 2-methyl-(4-methylthiophenyl)-2-morpholino-1-propan-1-one and 2-benzyl-2-dimethylamino-1-(4-morpholinophenyl)-butan-1-one; benzophenone compounds, such as benzophenone, 4,4'-bis(dimethylamino)benzophenone, 4,4'-bis(diethylamino)benzophenone, 2,4,6-trimethylaminobenzophenone, methyl-o-benzoylbenzoate, 3,3-dimethyl-4-methoxybenzophenone and 3,3',4,4'-tetra(t-butylperoxycarbonyl)benzophenone; fluorenone compounds, such as 9-fluorenone, 2-chloro-9-fluorenone and 2-methyl-9-fluorenone; thioxanthone compounds, such as thioxanthone, 2,4-diethylthioxanthone, 2-chlorothioxanthone, 1-chloro-4-propyloxythioxanthone, isopropylthioxanthone and diisopropylthioxanthone; xanthone compounds, such as xanthone and 2-methylxanthone; anthraquinone compounds, such as anthraquinone, 2-methylanthraquinone, 2-ethylanthraquinone, t-butylanthraquinone and 2,6-dichloro-9,10-anthraquinone; acridine compounds, such as 9-phenylacridine, 1,7-bis(9-acridinyl) heptane, 1,5-bis(9-acridinyl)pentane and 1,3-bis(9-acridinyl) propane; dicarbonyl compounds, such as 1,7,7-trimethyl-bicyclo[2,2,1]heptane-2,3-dione and 9,10-phenanthrenequinone; phosphine oxide compounds, such as 2,4,6-trimethylbenzoyldiphenylphosphine oxide, bis(2,6-dimethoxybenzoyl)-2,4,4-trimethylpentylphosphine oxide and bis(2,6-dichlorobenzoyl)propylphosphine oxide; amine synergists, such as methyl-4-(dimethylamino)benzoate, ethyl-4-(dimethylamino)benzoate, 2-n-butoxyethyl-4-(dimethylamino)benzoate, 2,5-bis(4-diethylaminobenzal)cyclopentanone, 2,6-bis(4-diethylaminobenzal)cyclohexanone and 2,6-bis(4-diethylaminobenzal)-4-methyl-cyclohexanone; coumarin compounds, such as 3,3'-carbonylvinyl-7-(diethylamino)coumarin, 3-(2-benzothiazolyl)-7-(diethylamino)coumarin, 3-benzoyl-7-(diethylamino)coumarin, 3-benzoyl-7-methoxy-coumarin and 10,10'-carbonylbis[1,1, 7,7-tetramethyl-2,3,6,7-tetrahydro-1H,5H,11H—Cl]-benzopyrano[6,7,8-ij]-quinolizin-1'-one; chalcone compounds, such as 4-diethylaminochalcone and 4-azidobenzalacetphenone; 2-benzoylmethylene; and 3-methyl-β-naphthothiazoline. These photoinitiators may be used alone or as a mixture of two or more thereof.

The solvent is selected from the group consisting of ethylene glycol monomethyl ether acetate, propylene glycol monomethyl ether acetate, dibutyl ether, cyclohexanone, 2-heptanone, 2-ethoxyethyl acetate, propylene glycol monoethyl ether acetate, 2-methoxyethyl acetate, methyl 3-methoxypropionate, dipropylene glycol dimethyl ether, diethylene glycol butyl ether, diethylene glycol dimethyl ether, 3-methoxybutyl acetate, ethyl 3-ethoxypropionate, dipropylene glycol methyl ether acetate, dipropylene glycol butyl ether, dipropylene glycol monomethyl ether, diethylene glycol diethyl ether, ethylene glycol monoacetate, ethylene glycol diacetate, and mixtures thereof.

It will be obvious to those skilled in the art that one or more additives may be added to the photosensitive resin composition of the present invention so long as they do not impair the physical properties of the photosensitive resin composition. Further, those skilled in the art will appreciate that even though the following examples illustrate only a few examples of the individual components constituting the photosensitive resin composition of the present invention, various equivalents included in the components can also produce effects similar to those of the components.

The following examples serve to illustrate the preferred embodiments of the present invention and they are not intended to limit the invention.

EXAMPLES

Synthesis Example 1

83 g of benzyl methacrylate, 18 g of methacrylic acid, 14 g of N-phenylmaleimide, 10 g of styrene, 2.5 g of 3-mercaptopropionic acid as a chain transfer agent and 370 g of 3-methoxy butyl acetate as a solvent were mixed using a mechanical stirrer in a reactor under a nitrogen atmosphere for 30 min. The reactor was heated to 70° C. under a nitrogen atmosphere. When the temperature of the mixture reached 70° C., 3.3 g of azobisisobutyronitrile (AIBN) as a thermal polymerization initiator was introduced into the reactor. The mixture was stirred for 8 hr to give a polymer. Then, the reactor was heated to 80° C. Stirring was continued for 30 min to complete the synthesis of a desired acrylic resin.

The acrylic resin was found to have an acid value of 100 mgKOH/g. The acrylic resin had a weight average molecular weight of 7,000 g/mol on a polystyrene basis, as determined by gel permeation chromatography (GPC).

Synthesis Example 2

101 g of benzyl methacrylate, 23 g of methacrylic acid, 0.9 g of 3-mercaptopropionic acid as a chain transfer agent and 370 g of 3-methoxy butyl acetate as a solvent were mixed using a mechanical stirrer in a reactor under a nitrogen atmosphere for 30 min. The reactor was heated to 70° C. under a nitrogen atmosphere. When the temperature of the mixture reached 70° C., 2.5 g of AIBN as a thermal polymerization initiator was introduced into the reactor. The mixture was stirred for 8 hr to give a polymer. Then, the reactor was heated to 80° C. To the reactor were added 0.3 g of tetrabutylammonium bromide and 0.1 g of monomethyl ether of hydroquinone (MEHQ) as a thermal polymerization inhibitor, followed by stirring for 30 min. 10 g of glycidyl methacrylate was added to the polymer solution. Stirring was continued at 120° C. for 12 hr to complete the synthesis of a desired acrylic resin.

The acrylic resin was found to have an acid value of 90 mgKOH/g. The acrylic resin had a weight average molecular weight of 22,000 g/mol on a polystyrene basis, as determined by GPC.

Comparative Synthesis Example 1

62 g of benzyl methacrylate, 45 g of methacrylic acid, 10 g of N-phenylmaleimide, 7 g of styrene, 2.5 g of 3-mercaptopropionic acid as a chain transfer agent and 370 g of 3-methoxy butyl acetate as a solvent were mixed using a mechanical stirrer in a reactor under a nitrogen atmosphere for 30 min. The reactor was heated to 70° C. under a nitrogen atmosphere. When the temperature of the mixture reached 70° C., 2.7 g of AIBN as a thermal polymerization initiator was introduced into the reactor. The mixture was stirred for 8 hr to give a polymer. Then, the reactor was heated to 80° C. To the reactor were added 0.5 g of tetrabutylammonium bromide and 0.1 g of MEHQ as a thermal polymerization inhibitor, followed by stirring for 30 min. 43 g of glycidyl methacrylate was added to the polymer solution. Stirring was continued at 120° C. for 12 hr to complete the synthesis of a desired acrylic resin.

The acrylic resin was found to have an acid value of 80 mgKOH/g. The acrylic resin had a weight average molecular weight of 10,000 g/mol on a polystyrene basis, as determined by GPC.

Comparative Synthesis Example 2

30 g of benzyl methacrylate, 36 g of methacrylic acid, 20 g of N-phenylmaleimide, 14 g of styrene, 0.5 g of 3-mercaptopropionic acid as a chain transfer agent and 400 g of 3-methoxy butyl acetate as a solvent were mixed using a mechanical stirrer in a reactor under a nitrogen atmosphere for 30 min. The reactor was heated to 70° C. under a nitrogen atmosphere. When the temperature of the mixture reached 70° C., 2.7 g of AIBN as a thermal polymerization initiator was introduced into the reactor. The mixture was stirred for 8 hr to give a polymer. Then, the reactor was heated to 80° C. To the reactor were added 0.5 g of tetrabutylammonium bromide and 0.1 g of MEHQ as a thermal polymerization inhibitor, followed by stirring for 30 min. 25 g of glycidyl methacrylate was added to the polymer solution. Stirring was continued at 120° C. for 12 hr to complete the synthesis of a desired acrylic resin.

The acrylic resin was found to have an acid value of 115 mgKOH/g. The acrylic resin had a weight average molecular weight of 17,000 g/mol on a polystyrene basis, as determined by GPC.

Example 1

Preparation of Photosensitive Resin Composition 5 g of a mixture of C.I. PIGMENT GREEN 36 (G36) and C.I. PIGMENT YELLOW 150 (Y150) as a colorant, 3 g of the resin prepared in Synthesis Example 1, 3 g of the resin prepared in Synthesis Example 2, 3 g of dipentaerythritol hexaacrylate as a polymerizable compound, 1 g of a mixture of an acetophenone initiator, a triazine initiator and a sensitizer as a photoinitiator, and 85 g of a mixture of propylene glycol monoethyl ether acetate (PGMEA), 3-methoxybutyl acetate (3-MBA) and dipropylene glycol monomethyl ether (DPM) as an organic solvent were mixed using a shaker for 1.5 hr. The mixture was allowed to stand at room temperature for 1.5 hr for stabilization.

Comparative Example 1

Preparation of Photosensitive Resin Composition

A photosensitive resin composition was prepared in the same manner as in Example 1, except that the resin prepared in Comparative Synthesis Example 1 was used instead of the resin prepared in Synthesis Example 1.

Comparative Example 2

Preparation of Photosensitive Resin Composition

A photosensitive resin composition was prepared in the same manner as in Example 1, except that the resin prepared in Comparative Synthesis Example 2 was used instead of the resin prepared in Synthesis Example 2.

<Evaluation of Adhesion to Substrates>

Each of the photosensitive resin compositions prepared in Example 1 and Comparative Examples 1 and 2 was applied to a glass substrate by spin coating and prebaked at about 90° C. for 100 sec to form a uniform film having a thickness of about 1.8 μm. The film was exposed to light at an exposure dose of 40 mJ/cm$^2$ through a soda lime mask and developed with 0.043% KOH solution at 25° C. for 80 sec to form a pattern. The degree of loss of the pattern was observed under an optical microscope and was evaluated as the adhesion of the pattern to the substrate. The results are shown in Table 1.

<Formation of Fine Patterns and Evaluation of High Resolution (1)>

Each of the photosensitive resin compositions prepared in Example 1 and Comparative Examples 1 and 2 was applied to a glass substrate by spin coating and prebaked at about 90° C. for 100 sec to form a uniform film having a thickness of about 1.8 μm. The film was exposed to light at an exposure dose of 40 mJ/cm$^2$ through a quartz mask having different hole pattern sizes and shapes and developed with 0.043% KOH solution at 25° C. for 60 sec to form patterns. The sizes and shapes of the patterns were observed under a scanning electron microscope (SEM) to evaluate the ability of the photosensitive resin composition to form a fine pattern and the high resolution of the photosensitive resin composition. The results are shown in Table 1. As the hole pattern size increases, the photosensitive resin composition is considered to have a higher resolution. Herein, the hole was in the form of a square, not circular.

TABLE 1

| Adhesion to substrate | Example 1 No loss of the pattern | Comparative Example 1 ⅔ of the pattern lost | Comparative Example 2 ⅓ of the pattern lost |
|---|---|---|---|
| 20 μm hole pattern size (μm) | 16.1 | 14.9 | 17.1 |
| 30 μm hole pattern size (μm) | 22.1 | 19.1 | 20.8 |
| 55 μm hole pattern size (μm) | 47.8 | 46.6 | 47.8 |
| 30 μm circular hole pattern size (μm) | 18.5 | 18.3 | 18.1 |

As can be seen from the results in Table 1, the photosensitive resin composition prepared in Example 1, which comprises the acrylic resins prepared in Synthesis Examples 1 and 2, showed improved adhesion to the underlying substrate and is expected to have the ability to form a fine pattern, compared to the photosensitive resin compositions prepared in Comparative Examples 1 and 2. That is, the photosensitive resin composition prepared in Example 1, which comprises a blend of the acrylic resin (Synthesis Example 1) containing no reactive group and the acrylic resin (Synthesis Example 2) containing reactive groups, whose molecular weights are different, as an alkali-soluble binder resin, showed better results in terms of the adhesion to the underlying substrate and the ability to form a fine pattern over the photosensitive resin compositions prepared in Comparative Examples 1 and 2, each of which comprises the binder resin (Comparative Synthesis Example 1 or 2) including monomers whose characteristics are different.

Next, the following experiments were conducted to determine an appropriate mixing ratio between the acrylic resins prepared in Synthesis Examples 1 and 2 in photosensitive resins.

Example 2

Preparation of Photosensitive Resin Composition 5 g of a mixture of G36 and Y150 as a colorant, 6 g of a mixture of the resins prepared in Synthesis Examples 1 and 2 in a weight ratio of 1:1 as an alkali-soluble binder resin, 3 g of dipentaerythritol hexaacrylate as a polymerizable compound, 1 g of a mixture of an acetophenone initiator, a triazine initiator and a sensitizer as a photoinitiator, and 85 g of a mixture of PGMEA, 3-MBA and DPM as an organic solvent were mixed using a shaker for 1.5 hr. The mixture was allowed to stand at room temperature for 1.5 hr for stabilization.

Example 3

Preparation of Photosensitive Resin Composition

A photosensitive resin composition was prepared in the same manner as in Example 2, except that the resins prepared in Synthesis Examples 1 and 2 were mixed in a weight ratio of 2:1.

Example 4

Preparation of Photosensitive Resin Composition

A photosensitive resin composition was prepared in the same manner as in Example 2, except that the resins prepared in Synthesis Examples 1 and 2 were mixed in a weight ratio of 3:1.

Example 5

Preparation of Photosensitive Resin Composition

A photosensitive resin composition was prepared in the same manner as in Example 2, except that the resins prepared in Synthesis Examples 1 and 2 were mixed in a weight ratio of 4:1.

<Formation of Fine Patterns and Evaluation of High Resolution (2)>

Each of the photosensitive resin compositions prepared in Examples 2-5 was applied to a glass substrate by spin coating and prebaked at about 90° C. for 100 sec to form a uniform film having a thickness of about 1.8 μm. The film was exposed to light at an exposure dose of 40 mJ/cm$^2$ through a quartz mask having different hole and stripe pattern sizes, and developed with 0.043% KOH solution at 25° C. for 60 sec to form patterns. The sizes and shapes of the patterns were observed under a scanning electron microscope (SEM) to evaluate the ability of the photosensitive resin composition to form a fine pattern and the high resolution of the photosensitive resin composition. The results are shown in Table 2. As the hole pattern size increases and the stripe critical dimension (CD) decreases, the photosensitive resin composition is considered to have a higher resolution.

TABLE 2

| Photosensitive resin composition | Example 2 | Example 3 | Example 4 | Example 5 |
|---|---|---|---|---|
| 20 μm hole pattern size (μm) | 2.98 | 2.58 | 5.56 | 3.97 |
| 28 μm hole pattern size (μm) | 12.9 | 15.5 | 17.3 | 17.1 |
| 30 μm hole pattern size (μm) | 13.1 | 18.1 | 20.0 | 19.6 |
| 5 μm stripe pattern CD (μm) | 16.5 | 14.7 | 12.7 | 12.3 |
| 10 μm stripe pattern CD (μm) | 19.2 | 19.2 | 18.1 | 17.5 |
| 15 μm stripe pattern CD (μm) | 23.6 | 23.2 | 22.5 | 22.0 |

As can be seen from the results in Table 2, the most preferred fine patterns were formed when the 3:1 (w/w) mixture of the resins prepared in Synthesis Examples 1 and 2 was used as a photosensitive resin.

Figure 2:
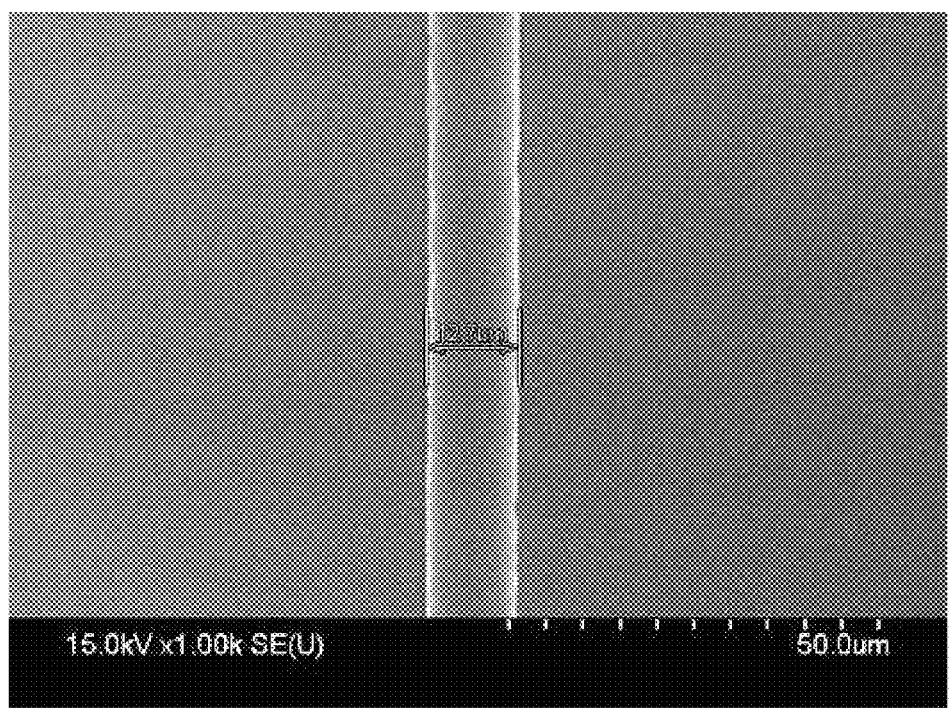
FIG. 2 is a scanning electron microscopy (SEM) image of a pattern formed using a photosensitive resin composition prepared in Example 3 through a mask having a 5 μm wide linear pattern.

FIGS. 1 and 2 are SEM images showing the patterns, whose shapes correspond to the shapes of the mask, formed using the composition of Example 3. The images reveal high resolution of the patterns and good adhesion of the composition to the substrate.

As is apparent from the foregoing, the photosensitive resin composition of the present invention can form a high resolution fine pattern without causing any disadvantage in terms of processability. In addition, the photosensitive resin composition of the present invention provides good adhesion to an underlying substrate while forming a fine pattern.

What is claimed is:

1. A photosensitive resin composition comprising, as an alkali-soluble binder resin, a blend of a first binder resin and a second binder resin;

wherein the first binder resin has a weight average molecular weight greater than or equal to 1,000 and less than 20,000, contains no unsaturated double bonds and contains repeating units of Formulae 1, 2 and 3:

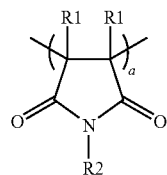
(1)

(wherein each R1 is independently a hydrogen atom or a methyl group, R2 is selected from the group consisting of $C_1$-$C_{10}$ alkyl groups; $C_1$-$C_6$ alkyl ester groups; phenyl groups substituted with one or more $C_1$-$C_3$ alkyl groups; and phenyl groups substituted with one or more halogen atoms, and a is the number of monomeric units ranging from 10 to 30);

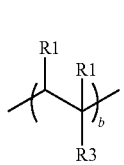
(2)

(wherein each R1 is independently a hydrogen atom or a methyl group, R3 is selected from the group consisting of $C_2$-$C_6$ alkylene ester groups substituted with one or more phenyl groups (in which each phenyl is optionally substituted with $C_1$-$C_3$ alkyl, halogen or hydroxyl group); $C_2$-$C_8$ alkylene ester groups; phenylene ester groups unsubstituted or substituted with a $C_1$-$C_3$ alkyl group or a halogen atom; phenyl groups optionally substituted with $C_1$-$C_3$ alkyl, halo or hydroxyl group; and $C_1$-$C_4$ alkyl groups substituted with one or more phenyl groups, and b is the number of monomeric units ranging from 10 to 80);

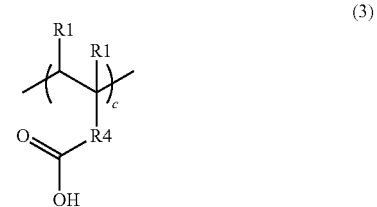

(wherein each R1 is independently a hydrogen atom or a methyl group, and R4 is a direct bond; or is selected from the group consisting of $C_1$-$C_{10}$ alkylene groups; $C_1$-$C_6$ alkylene groups substituted with one or more halogen atoms; and $C_1$-$C_6$ alkylene groups substituted with one or more phenyl groups, and c is the number of monomeric units ranging from 10 to 40); and wherein the second binder resin has a weight average molecular weight greater than or equal to 20,000 and less than 80,000 and contains unsaturated double bonds as reactive groups.

2. The photosensitive resin composition of claim 1, wherein a weight ratio of the first binder resin to the second binder resin is 1:1 to 4:1.

3. The photosensitive resin composition of claim 1, wherein the second binder resin contains repeating units of Formulae 4, 5 and 6:

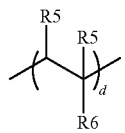
(4)

wherein each R5 is independently a hydrogen atom or a methyl group, R6 is selected from the group consisting of $C_2$-$C_6$ alkylene ester groups substituted with one or more phenyl groups (in which each phenyl is optionally substituted with $C_1$-$C_3$ alkyl, halogen or hydroxyl group); $C_2$-$C_8$ alkylene ester groups; and phenylene ester groups unsubstituted or substituted with a $C_1$-$C_3$ alkyl group or a halogen atom, and d is the number of monomeric units ranging from 10 to 80;

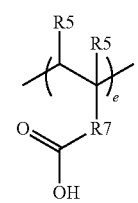
(5)

wherein each R5 is independently a hydrogen atom or a methyl group, and R7 is a direct bond; or is selected from the group consisting of $C_1$-$C_{10}$ alkylene groups; $C_1$-$C_6$ alkylene groups substituted with one or more halogen atoms; and $C_1$-$C_6$ alkylene groups substituted with one or more phenyl groups, and e is the number of monomeric units ranging from 10 to 40;

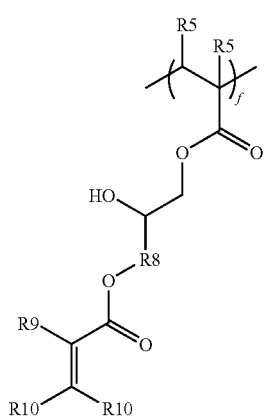

(6)

wherein each R5 is independently a hydrogen atom or a methyl group, R8 is selected from the group consisting of $C_1$-$C_{10}$ alkylene groups; and $C_1$-$C_6$ alkylene groups substituted with one or more halogen atoms; R9 is a hydrogen atom or a methyl group, each R10 is independently a hydrogen atom or a $C_1$-$C_3$ alkyl group, and f is the number of monomeric units ranging from 10 to 50.

4. The photosensitive resin composition of claim 1, wherein the alkali-soluble binder resin has an acid value of 50 to 200 mg KOH/g and a weight average molecular weight of 1,000 to 80,000.

5. The photosensitive resin composition of claim 1, wherein the alkali-soluble binder resin is present in an amount of 5 to 30% by weight, based on the total weight of the photosensitive resin composition.

6. The photosensitive resin composition of claim 1, wherein the photosensitive resin composition comprises 1 to 30% by weight of polymerizable compound, 0.5 to 5% by weight of photoinitiator, 3 to 30% by weight of colorant, and 10 to 90% by weight of solvent.

7. The photosensitive resin composition of claim 6, wherein the polymerizable compound is selected from: compounds obtained by esterifying a polyhydric alcohol with an α,β-unsaturated carboxylic acid; compounds obtained by adding (meth)acrylic acid to a glycidyl group-containing compound; esterified products of a compound having at least one hydroxyl group or ethylenically unsaturated bond with a polyvalent carboxylic acid, and adducts thereof with polyisocyanate; alkyl esters of (meth)acrylic acid; and mixtures thereof.

8. The photosensitive resin composition of claim 6, wherein the photoinitiator is selected from the group consisting of 2,4-trichloromethyl-(4'-methoxyphenyl)-6-triazine, 2,4-trichloromethyl-(4'-methoxystyryl)-6-triazine, 2,4-trichloromethyl-(piperonyl)-6-triazine, 2,4-trichloromethyl-(3',4'-dimethoxyphenyl)-6-triazine, 3-{4-[2,4-bis(trichloromethyl)-s-triazin-6-yl]phenylthio}propanoic acid, 2,2'-bis(2-chlorophenyl)-4,4',5,5'-tetraphenylbiimidazole, 2,2'-bis(2,3-dichlorophenyl)-4,4',5,5'-tetraphenylbiimidazole, 2-hydroxy-2-methyl-1-phenylpropan-1-one, 1-(4-isopropylphenyl)-2-hydroxy-2-methylpropan-1-one, 4-(2-hydroxyethoxy)-phenyl (2-hydroxy)propyl ketone, 1-hydroxycyclohexyl phenyl ketone, benzoin methyl ether, benzoin ethyl ether, benzoin isobutyl ether, benzoin butyl ether, 2,2-dimethoxy-2-phenyl acetophenone, 2-methyl-(4-methylthiophenyl)-2-morpholino-1-propan-1-one, 2-benzyl-2-dimethylamino-1-(4-morpholinophenyl)-butan-1-one, benzophenone, 4,4'-bis(dimethylamino)benzophenone, 4,4'-bis(diethylamino)benzophenone, 2,4,6-trimethylaminobenzophenone, methyl-o-benzoylbenzoate, 3,3-dimethyl-4-methoxybenzophenone, 3,3',4,4'-tetra(t-butylperoxycarbonyl)benzophenone, 9-fluorenone, 2-chloro-9-fluorenone, 2-methyl-9-fluorenone, thioxanthone, 2,4-diethylthioxanthone, 2-chlorothioxanthone, 1-chloro-4-propyloxythioxanthone, isopropylthioxanthone, diisopropylthioxanthone, xanthone, 2-methylxanthone, anthraquinone, 2-methylanthraquinone, 2-ethylanthraquinone, t-butylanthraquinone, 2,6-dichloro-9,10-anthraquinone, 9-phenylacridine, 1,7-bis(9-acridinyl)heptane, 1,5-bis(9-acridinyl)pentane, 1,3-bis(9-acridinyl)propane, 1,7,7-trimethyl-bicyclo[2,2,1]heptane-2,3-dione, 9,10-phenanthrenequinone, 2,4,6-trimethylbenzoyldiphenylphosphine oxide, bis(2,6-dimethoxybenzoyl)-2,4,4-trimethylpentylphosphine oxide, bis(2,6-dichlorobenzoyl)propylphosphine oxide, methyl-4-(dimethylamino)benzoate, ethyl-4-(dimethylamino)benzoate, 2-n-butoxyethyl-4-(dimethylamino)benzoate, 2,5-bis(4-diethylaminobenzal)cyclopentanone, 2,6-bis(4-diethylaminobenzal)cyclohexanone, 2,6-bis(4-diethylaminobenzal)-4-methyl-cyclohexanone, 3,3'-carbonylvinyl-7-(diethylamino)coumarin, 3-(2-benzothiazolyl)-7-(diethylamino)coumarin, 3-benzoyl-7-(diethylamino)coumarin, 3-benzoyl-7-methoxy-coumarin, 10,10'-carbonylbis[1,1,7,7-tetramethyl-2,3,6,7-tetrahydro-1H,5H,11H—Cl]-benzopyrano[6,7,8-ij]-quinolizin-11-one, 4-diethylaminochalcone, 4-azidobenzalacetphenone, 2-benzoylmethylene, 3-methyl-β-naphthothiazoline, and mixtures thereof.

9. The photosensitive resin composition of claim 6, wherein the solvent is selected from the group consisting of ethylene glycol monomethyl ether acetate, propylene glycol monomethyl ether acetate, dibutyl ether, cyclohexanone, 2-heptanone, 2-ethoxyethyl acetate, propylene glycol monoethyl ether acetate, 2-methoxyethyl acetate, methyl 3-methoxypropionate, dipropylene glycol dimethyl ether, diethylene glycol butyl ether, diethylene glycol dimethyl ether, 3-methoxybutyl acetate, ethyl 3-ethoxypropionate, dipropylene glycol methyl ether acetate, dipropylene glycol butyl ether, dipropylene glycol monomethyl ether, diethylene glycol diethyl ether, ethylene glycol monoacetate, ethylene glycol diacetate, and mixtures thereof.

10. The photosensitive resin composition of claim 6, wherein the colorant is selected from the group consisting of Carmine 6B (C.I. 12490), Phthalocyanine Green (C.I. 74260), Phthalocyanine Blue (C.I. 74160), Perylene Black (BASF K0084 and K0086), Cyanine Black, Lionol Yellow (C.I. 21090), Lionol Yellow GRO(C.I. 21090), Benzidine Yellow 4T-564D, Victoria Pure Blue (C.I.42595), C.I. PIGMENT RED 3, 23, 97, 108, 122, 139, 140, 141, 142, 143, 144, 149, 166, 168, 175, 177, 180, 185, 189, 190, 192, 202, 214, 215, 220, 221, 224, 230, 235, 242, 254, 255, 260, 262, 264 and 272, C.I. PIGMENT GREEN 7 and 36, C.I. PIGMENT BLUE 15:1, 15:3, 15:4, 15:6, 16, 22, 28, 36, 60 and 64, C.I. PIGMENT YELLOW 13, 14, 35, 53, 83, 93, 95, 110, 120, 138, 139, 150, 151, 154, 175, 180, 181, 185, 194 and 213, C.I. PIGMENT VIOLET 15, 19, 23, 29, 32 and 37, white pigments, fluorescent pigments, and mixtures thereof.

* * * * *